(12) United States Patent
Li et al.

(10) Patent No.: US 10,742,223 B2
(45) Date of Patent: Aug. 11, 2020

(54) METHOD AND DEVICE FOR CALIBRATING RC OSCILLATOR, STORAGE MEDIUM AND PROCESSOR

(71) Applicant: Beijing Sigma Microelectronics Co., Ltd, Beijing (CN)

(72) Inventors: Zhiqian Li, Beijing (CN); Zhixun Yang, Beijing (CN)

(73) Assignee: BEIJING SIGMA MICROELECTRONICS CO., LTD, Beijing (CN)

( * ) Notice: Subject to any disclaimer, the term of this patent is extended or adjusted under 35 U.S.C. 154(b) by 0 days.

(21) Appl. No.: 16/189,050

(22) Filed: Nov. 13, 2018

(65) Prior Publication Data
US 2019/0149156 A1    May 16, 2019

(51) Int. Cl.
| | | |
|---|---|---|
| H03L 7/00 | (2006.01) | |
| H03L 7/099 | (2006.01) | |
| H03B 5/20 | (2006.01) | |
| H03B 5/06 | (2006.01) | |
| H03L 7/085 | (2006.01) | |

(52) U.S. Cl.
CPC .......... H03L 7/099 (2013.01); H03B 5/06 (2013.01); H03B 5/20 (2013.01); H03L 7/085 (2013.01)

(58) Field of Classification Search
CPC . H03L 7/099; H03L 7/085; H03L 7/00; H03L 7/18; H03B 5/06; H03B 5/20; G06F 13/4068

USPC .......................................................... 331/34
See application file for complete search history.

(56) References Cited

U.S. PATENT DOCUMENTS

| | | | | |
|---|---|---|---|---|
| 5,708,971 A | * | 1/1998 | Dent | G08B 3/1008 340/7.22 |
| 2009/0141781 A1 | * | 6/2009 | Azenkot | H03J 7/04 375/219 |
| 2013/0128933 A1 | * | 5/2013 | Hsu | H04L 12/6418 375/219 |
| 2019/0280725 A1 | * | 9/2019 | Pister | H03K 3/0315 |

* cited by examiner

*Primary Examiner* — Richard Tan
(74) *Attorney, Agent, or Firm* — Cantor Colburn LLP

(57) ABSTRACT

A method and device for calibrating an RC oscillator, a storage medium and a processor are provided. The method may include: in a first communication time period, a frequency of a first RC oscillator is adjusted at a first communication frequency point; at the first communication frequency point, the frequency of the first RC oscillator is adjusted according to a default gear of the first RC oscillator sequentially, and at least one of a corresponding gear value and a corresponding frequency when the first device end may receive or may not receive data sent by a second device end is recorded; a first target frequency and a first target gear value of the first RC oscillator are determined according to the at least one of a corresponding gear value and a corresponding frequency; and the first device end is controlled to communicate with the second device end at a second communication frequency point which is determined by the first target gear value in a second communication time period.

10 Claims, 2 Drawing Sheets

METHOD AND DEVICE FOR CALIBRATING RC OSCILLATOR, STORAGE MEDIUM AND PROCESSOR

CROSS REFERENCE TO RELATED APPLICATION

This application is related to and claims the benefit of Chinese Patent Application Number 201711122337.X filed on Nov. 14, 2017, the contents of which are herein incorporated by reference in their entirety.

TECHNICAL FIELD

The present disclosure relates to the field of oscillators, and in particular to a method and device for calibrating an RC oscillator, a storage medium and a processor.

BACKGROUND

At present, many integrated circuits include RC oscillators configured to generate and offer internal clock signals to be used in each circuit. For example, a multivibrator for generating rectangle clock signals is used, and a clock frequency depends on an RC time constant of the multivibrator. However, due to production tolerance, for accurate operation of the oscillator, an expected clock frequency is corrected or calibrated generally.

In order to achieve this purpose, external clock signals are offered to a calibrating circuit generally, and generated by means of a crystal oscillator or an external microcontroller. Calibration coefficients of the RC oscillator are determined according to the external clock signals. These calibration coefficients may be stored in a nonvolatile memory during production of the integrated circuit with the RC oscillator so that a calibration processing is to be executed once. However, the nonvolatile memory (for example, one-time programmable (OTP) memory) occupies an area on the integrated circuit, thereby increasing a production cost.

In another traditional method for calibrating an internal RC oscillator, a crystal oscillator or a microcontroller is further provided to the integrated circuit to offer external reference clock signals, so that calibration should be implemented when electrifying the integrated circuit each time. Under this circumstance, calibration coefficients are stored in a volatile memory. But an external component (such as the crystal oscillator or the microcontroller) may generate additional cost. In addition, operations of the crystal oscillator or the microcontroller consume power, which is especially not expected in a mobile device.

An interface chip may also be equipped with one crystal oscillator to accordingly acquire a high precision. However, the interface chip needs two more pins to be led out, and a cost of an application system may be relatively high. Another method is to use a built-in RC oscillator on the interface chip, and this solution has low cost and would not increase the number of the pins, but the RC oscillator may not have favorable accuracy and stability. A traditional method for improving the accuracy of the RC oscillator is that the interface chip is detected before encapsulation during production, and R or C in a bare chip is subjected to fine tuning and correction with a laser photoetching method. In this method, the interface chips are subjected to a test during production, and corrected one by one according to a test result. Therefore, the water test has high cost, and this solution is unacceptable as for a chip of low value.

As to a problem in the related art that cost is great when improving a calibration accuracy of the RC oscillator, no effective solution has been proposed yet till now.

SUMMARY

At least some embodiments of the present disclosure provide a method and device for calibrating an RC oscillator, a storage medium and a processor, so as at least to partially solve a problem in the related art that the cost is great when improving the calibration accuracy of the RC oscillator.

In one embodiment the present disclosure provides a method for calibrating the RC oscillator. The method may include: adjusting, in a first communication time period, a frequency of a first RC oscillator at a first communication frequency point, and the first RC oscillator is arranged on a first device end, the first device end is configured to receive data sent by a second device end, and the second device end is equipped with a second RC oscillator; adjusting, at the first communication frequency point, the frequency of the first RC oscillator according to a default gear of the first RC oscillator sequentially, and recording at least one of a corresponding gear value and a corresponding frequency when the first device end receives or fails to receive the data sent by the second device end; determining a first target frequency and a first target gear value of the first RC oscillator according to the at least one of a corresponding gear value and a corresponding frequency, and the first target gear value is corresponding to the first target frequency; and controlling the first device end to communicate with the second device end at a second communication frequency point which is determined by the first target gear value in a second communication time period after determining the first target frequency and the first target gear value of the first RC oscillator.

In an optional embodiment, controlling the first device end to communicate with the second device end at the second communication frequency point which is determined by the first target gear value in the second communication time period includes: detecting whether or not the first device end successfully communicates with the second device end at the second communication frequency point in the second communication time period; controlling the first device end to communicate with the second device end at the second communication frequency point when successful communication between the first device end and the second device end is detected; and replacing the second communication frequency point with a third communication frequency point when failed communication between the first device end and the second device end is detected, and controlling the first device end to communicate with the second device end at the third communication frequency point in the second communication time period.

In an optional embodiment, controlling the first device end to communicate with the second device end at the second communication frequency point which is determined by the first target gear value in the second communication time period includes: recording, in the second communication time period, a first time count value between receiving, by the first device end, first data and receiving, by the first device end, second data from the second device end, and the first data is data sent last time before the second device end sends the second data; receiving data carrying a second time count value sent by the second device end through the first device end, and the second time count value is a time count value between sending, by the second device end, the first data and sending, by the second device end, the second data;

determine whether the first time count value and the second time count value meet preset standards; and correcting at least one of the gear value and the frequency of the first RC oscillator at the second communication frequency point according to a difference between the first time count value and the second time count value when determining that the first time count value and the second time count value do not meet the preset standards.

In an optional embodiment, the first device end is a sender, and the second device end is a receiver; and receiving, by the first device end, the data sent by the second device end including: receiving, by the receiver, first sub-data sent by the sender and sending, by the receiver, a first confirmation message to the sender in response to the first sub-data.

In an optional embodiment, the first device end is a receiver, and the second device end is a sender; and receiving, by the first device end, the data sent by the second device end including: receiving, by the receiver, the first sub-data sent by the sender.

In an optional embodiment, the method further includes: responding, under the circumstance that a frequency of the receiver is to be calibrated, to the data when the receiver receives the data sent by the sender to acquire a first confirmation message, sending the first confirmation message to the sender and adjusting the frequency of the receiver; or responding, under the circumstance that a frequency of the receiver is to be calibrated, to the data when the receiver receives the data sent by the sender to acquire a first confirmation message, and adjusting the frequency of the receiver, and the first confirmation message is failed to sent from the receiver to the sender.

In an optional embodiment, the method further includes: replacing the first communication frequency point with a fourth communication frequency point in the first communication time period when the first device end fails to receive the data sent by the second device end at the first communication frequency point; adjusting the frequency of the first RC oscillator at the fourth communication frequency point when the first communication frequency point is replaced with the fourth communication frequency point; determining the first target frequency and the first target gear value of the first RC oscillator according to a frequency gear value of the first RC oscillator adjusted at the fourth communication frequency point when the data sent by the second device end is received in the first communication time period; and continuing to replace the fourth communication frequency point with a fifth communication frequency point when the data sent by the second device end is not received in the first communication time period.

In an optional embodiment, frequency doubling is performed to the first RC oscillator and the second RC oscillator through a phase-locked loop to acquire communication frequency points, and the communication frequency point at least includes the first communication frequency point and the second communication frequency point.

In another embodiment of the present disclosure further provides a device for calibrating an RC oscillator. The device may include: an adjusting element, configured to adjust a frequency of a first RC oscillator at a first communication frequency point in a first communication time period, and the first RC oscillator is arranged on a first device end, the first device end is configured to receive data sent by a second device end, and the second device end is equipped with a second RC oscillator; a processing element, configured to adjust the frequency of the first RC oscillator according to a default gear of the first RC oscillator sequentially at the first communication frequency point and record at least one of a corresponding gear value and a corresponding frequency when the first device end receives or fails to receive the data sent by the second device end; a determining element, configured to determine a first target frequency and a first target gear value of the first RC oscillator according to the at least one of a corresponding gear value and a corresponding frequency, and the first target gear value is corresponding to the first target frequency; and a control element, configured to control the first device end to communicate with the second device end at a second communication frequency point which is determined by the first target gear value in a second communication time period after determining the first target frequency and the first target gear value of the first RC oscillator.

In another embodiment of the present disclosure further provides a storage medium which may include at least one stored program. When the at least one stored program runs, a device where the storage medium is located is controlled to execute the method for calibrating the RC oscillator.

In another embodiment of the present disclosure further provides a processor which is configured to run at least one program. When the at least one program runs, the processor implements the method for calibrating the RC oscillator.

Through the present disclosure, in a first communication time period, a frequency of a first RC oscillator is adjusted at a first communication frequency point. The first RC oscillator is arranged on a first device end, the first device end is configured to receive data which is sent by a second device end, and the second device end is equipped with a second RC oscillator. At the first communication frequency point, the frequency of the first RC oscillator is adjusted according to a default gear of the first RC oscillator sequentially, and at least one of a corresponding gear value and a corresponding frequency when the first device end may receive or may not receive the data sent by the second device end is recorded. A first target frequency and a first target gear value of the first RC oscillator are determined according to the at least one of a corresponding gear value and a corresponding frequency, and the first target gear value is corresponding to the first target frequency. After determining the first target frequency and the first target gear value of the first RC oscillator, the first device end is controlled to communicate with the second device end at a second communication frequency point which is determined by the first target gear value in a second communication time period. The problem that the cost is great when improving the calibration accuracy of the RC oscillator is solved, and accordingly an effect of reducing the cost is achieved when improving the calibration accuracy of the RC oscillator.

BRIEF DESCRIPTION OF THE DRAWINGS

Drawings forming part of the application are used to further understand the present disclosure, and schematic embodiments and description of the present disclosure are used to explain the present disclosure rather than limit the present disclosure inappropriately. In the drawings.

DETAILED DESCRIPTION

It is to be noted that the embodiments in the application and characteristics in the embodiments may be combined together under the circumstance that no conflict occurs. The present disclosure will be further described below with reference to drawings and in combination with the embodiments in detail.

In order to make the solutions of the application better understood by those skilled in the art, the technical solutions in the embodiments of the application will be clearly and completely described below in combination with the drawings in the embodiments of the application. It is apparent that the described embodiments are not all embodiments but part of embodiments of the application. All other embodiments obtained by those of ordinary skill in the art on the basis of the embodiments in the application without creative work shall fall within the scope of protection of the application.

It is to be noted that terms "first", "second" and the like in the description, claims and the above drawings of the application are adopted not to describe a specific sequence or order but to distinguish similar objects. It is to be understood that data that is used in this way may be interchangeable if appropriate to facilitate description of the embodiments of the application here. In addition, terms "include" and "have" and any transformation thereof are intended to cover nonexclusive inclusions. For example, a process, method, system, product or device including a series of operations or elements is not limited to the operations or elements which are listed clearly, but may alternatively further include operations or elements which are not listed clearly or alternatively further include other operations or elements intrinsic to the process, the method, the product or the device.

Embodiment One

The embodiment of the present disclosure provides a method for calibrating an RC oscillator.

Figure 1:
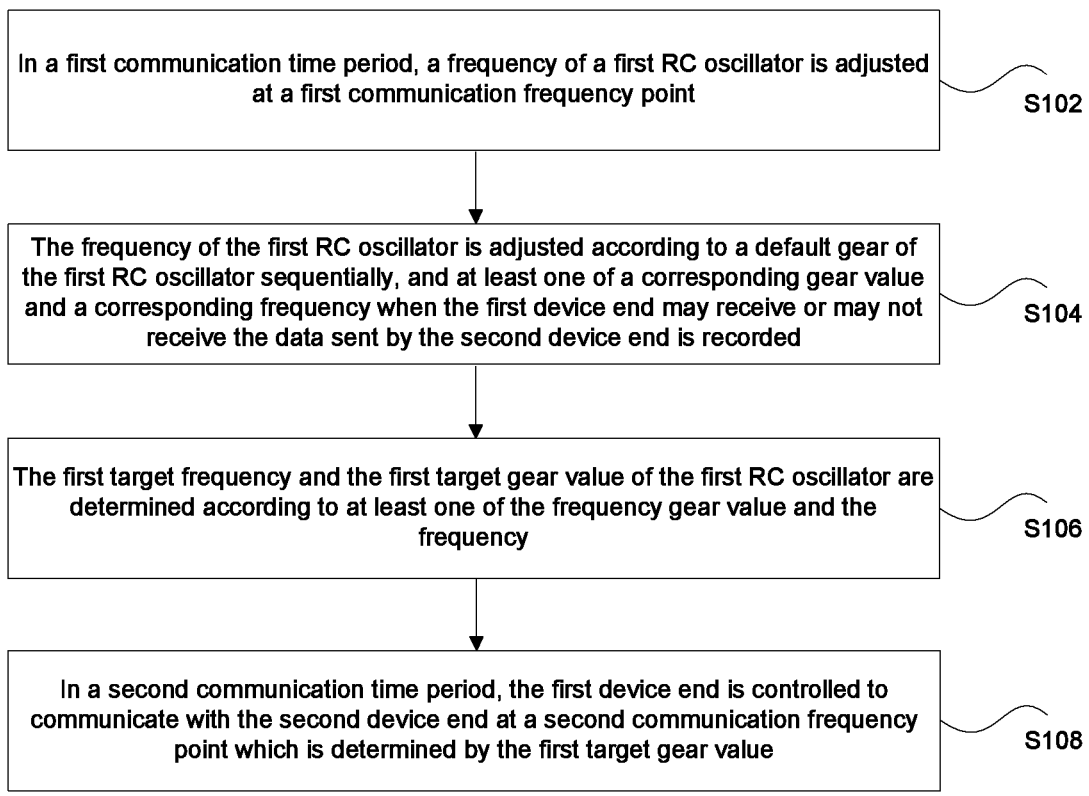
FIG. 1 is a flowchart of a method for calibrating an RC oscillator according to an embodiment of the present disclosure.

FIG. 1 is a flowchart of the method for calibrating the RC oscillator according to the embodiment of the present disclosure. As shown in FIG. 1, the method for calibrating the RC oscillator includes the following steps.

At step S102, in a first communication time period, a frequency of a first RC oscillator is adjusted at a first communication frequency point.

In the technical solution provided by the above S102 of the present disclosure, the frequency of the first RC oscillator is adjusted at the first communication frequency point in the first communication time period. The first RC oscillator is arranged on a first device end, the first device end is configured to receive data sent by a second device end, and the second device end is equipped with a second RC oscillator.

In the embodiment, wireless communication is implemented between the first device end and the second device end, and a wireless communication time period may be divided into a clock calibration time period T1 and a data communication time period T2. The clock calibration time period T1 and the data communication time period T2 each have several optional frequency points for communication.

When the first device end communicates with the second device end, the first RC oscillator of the first device end may use a default correction gear to generate a frequency point f1, and the RC oscillator of the second device end may use the default correction gear to generate a frequency point f1' as well. Due to influence of such factors as manufacturing process, temperature and voltage, there may be a frequency deviation between the RC oscillators of the first device end and the second device end, and f1 may be inconsistent with f1'. When f1 is inconsistent with f1', the first device end may not communicate with the second device end normally. The first device end may communicate with the second device end when f1 is consistent with f1'.

The first communication time period of the embodiment may be the clock calibration time period T1, and a calibration frequency point may be the first communication frequency point. The first communication frequency point is obtained through frequency doubling in presence of a phase-locked loop on a basis of the frequency of the first RC oscillator, and may be represented by f1. For example, f1 may be 2.4 GHz, 2.41 GHz, 2.42 GHz, 2.43 GHz, 2.44 GHz, 2.45 GHz, 2.46 GHz, 2.47 GHz, 2.48 GHz and so on, and would not be limited herein.

In the first communication time period, a frequency modulation interval of the first device end is different from a frequency modulation interval of the second device end. Within a certain time period, the communication frequency points of the first device end may be the same as the communication frequency points of the second device end, and the identical communication frequency point is corresponding to a moment at which the communication may be implemented.

In the first communication time period, the frequency of the first RC oscillator is adjusted at the first communication frequency point. The first RC oscillator is arranged on the first device end with different gears, and in this way the frequency of the first RC oscillator may be adjusted all the time at the first communication frequency point according to a gear which is set by the first RC oscillator. Optionally, each gear has a default adjusting direction which may be a positive adjusting direction and a negative adjusting direction. The first device end is configured to receive the data sent by the second device end. When the first device end is a receiver, the second device end is a sender. When the first device end is the sender, the second device end is the receiver. The second device end is equipped with the second RC oscillator.

In addition, the first RC oscillator and the second RC oscillator may correct the frequency through setting the gears when conditions permit.

At step S104, the frequency of the first RC oscillator is adjusted according to a default gear of the first RC oscillator sequentially, and at least one of a corresponding gear value and a corresponding frequency when the first device end may receive or may not receive the data sent by the second device end is recorded.

In the technical solution provided by the above S104 of the present disclosure, when adjusting the frequency of the first RC oscillator at the first communication frequency point, the frequency of the first RC oscillator is adjusted according to the default gear of the first RC oscillator sequentially at the first communication frequency point, and at least one of the corresponding gear value and the corresponding frequency when the first device end may receive or may not receive the data sent by the second device end is recorded.

The first RC oscillator of the embodiment is provided with the default gear, for example, 1‰, 2‰, 3‰, 4‰ and other default gears are set and not limited herein. When adjusting the frequency of the first RC oscillator at the first communication frequency point, the frequency of the first RC oscillator is adjusted according to the default gear of the first RC oscillator sequentially, for example, the frequency of the first RC oscillator is adjusted according to the 1‰, 2‰, 3‰, 4‰ and other default gears sequentially.

When adjusting the frequency of the first RC oscillator according to the default gear of the first RC oscillator sequentially, the first device end may or may not receive the data sent by the second device end. For example, when adjusting the frequency of the first RC oscillator according to the gear 1‰, the first device end may receive the data sent by the second device end, and at this moment the frequency of the first RC oscillator is continued to be adjusted according to the gear 2‰. When adjusting the frequency of the first RC oscillator according to the gear 2‰, the first device end may not receive the data sent by the second device end, and the frequency of the first RC oscillator is continued to be adjusted at this moment according to the gear 3‰. When adjusting the frequency of the first RC oscillator according to the gear 3‰, the first device end may receive the data sent by the second device end until the frequency of the first RC oscillator is adjusted according to a final default gear of the first RC oscillator. In the above process, at least one of the corresponding gear value and the corresponding frequency when the first device end may receive or may not receive the data sent by the second device end is recorded during adjustment of the frequency of the first RC oscillator at each default gear.

From the above, in this embodiment, at the first communication frequency point, when the frequency of the first RC oscillator is adjusted sequentially according to the default gear of the first RC oscillator, the first device end may or may not receive the data sent by the second device end. When the frequency of the first RC oscillator is adjusted according to the default gear of the first RC oscillator sequentially, at least one of the corresponding gear value and the corresponding frequency when the first device end may receive or may not receive the data sent by the second device end is recorded. At least one of the corresponding gear value and the corresponding frequency when the first device end may receive or may not receive the data sent by the second device end may be recorded after the frequency of the first RC oscillator is adjusted according to the default gear of the first RC oscillator completely so that a first target frequency and a first target gear value are determined according to at least one of the corresponding gear value and the corresponding frequency when the first device end may receive or may not receive the data sent by the second device end. For example, from the corresponding gear values when the first device end may receive or may not receive the data sent by the second device end, a mean value of all gears at which communication may be implemented normally is selected as the first target gear value of the RC oscillator of the first device end and the first target frequency is determined according to the first target gear value.

Optionally, when the frequency of the first RC oscillator is adjusted according to the default gear of the first RC oscillator sequentially, at the first communication frequency point, the frequency of the first RC oscillator is adjusted as a first frequency according to a first regulation, and the first frequency is recorded when the first device end fails to receive the data sent by the second device end. Under the first frequency, the first frequency is adjusted as a second frequency according to a second regulation and the second frequency is recorded when the first device end receives the data sent by the second device end. Under the second frequency, the first target frequency and the first target gear value of the first RC oscillator may be determined according to the gear value of the first frequency when the first device end fails to receive the data sent by the second device end.

Optionally, when the frequency of the first RC oscillator is adjusted as the first frequency according to the above first regulation, the frequency of the first RC oscillator is adjusted according to a first default gear of the first RC oscillator sequentially to acquire the first frequency. The first regulation is a regulation capable of adjusting according to a default direction of a gear set by the first RC oscillator, such as, adjusting toward a positive direction and a negative direction of the default gear sequentially. The frequency of the first RC oscillator may be adjusted according to the first default gear with changes of +1‰, −1‰, +2‰, −2‰, +3‰, −3‰ and so on. A signal "+" indicates that the frequency of the first RC oscillator is adjusted according to the positive direction of the gear, and a signal "−" indicates that the frequency of the first RC oscillator is adjusted according to the negative direction of the gear. The corresponding frequency and the corresponding gear value of the first RC oscillator are recorded when the frequency of the first RC oscillator is adjusted as the first frequency according to the above first regulation.

When the first frequency is adjusted as the second frequency according to the above second regulation, the first frequency is adjusted according to a second default gear of the first RC oscillator sequentially to acquire the second frequency. The second regulation is a regulation in which the first device end stops setting the gear toward an opposite direction when the first device end receives the data sent by the second device end, but sets the gear of the first RC oscillator toward the identical change direction again and adjusts the frequency of the first RC oscillator. For example, when the first default gear that is changed to +3‰ according to the first regulation, the first device end receives the data sent by the second device end, and gear communication is set toward the identical change direction. For example, the frequency of the first RC oscillator is adjusted by sequentially setting the second default gears as +4‰, +5‰, +6‰ and so on until the first device end may not communicate with the second device end normally. When determining the first target frequency and the first target gear value of the first RC oscillator according to the gear value of the first frequency, the first target frequency and the first target gear value are determined according to the gear value of the first frequency and the target gear value in the second default gear. Under the corresponding frequency of the target gear, the first device end receives the data sent by the second device end. The corresponding frequency and the corresponding gear value of the first RC oscillator are recorded when the first frequency of the first RC oscillator is adjusted as the second frequency according to the above second regulation.

From the above, in this embodiment, when the frequency of the first RC oscillator is adjusted according to the default gear of the first RC oscillator sequentially, the default gear value may be adjusted according to the positive direction and negative direction of the default gear. For example, in the first communication time period, the frequency of the first RC oscillator may be adjusted according to the first default gear with changes of +1‰, −1‰, +2‰, −2‰, +3‰, −3‰ and so on until the first device end receives the data sent by the second device end, and a gear is stopped setting in the opposite direction. However, the gear should be set again toward the identical change direction for communication until the first device end may not communicate with the second device end normally. For example, when the change is set to +3‰ and the first device end receives the data sent by the second device end, the gears +4‰, +5‰, +6‰, . . . should be set below sequentially to adjust the frequency of the first RC oscillator until the first device end may not receive the data sent by the second device end. In this way, the frequency of the first RC oscillator is adjusted according to the default gear of the first RC oscillator sequentially, and accordingly the first target frequency and the first target gear value of the first RC oscillator are determined according to the gear value of the first frequency. For example, a mean value of all gears at which the communication may be implemented normally is selected as gear setting of the RC oscillator of the sender.

At step S106, the first target frequency and the first target gear value of the first RC oscillator are determined according to at least one of the frequency gear value and the frequency.

In the technical solution provided by the above S106 of the present disclosure, the first target frequency and the first target gear value of the first RC oscillator are determined according to frequency gear values adjusted at the first communication frequency point when the first RC oscillator may receive or may not receive the data, and the first target gear value is corresponding to the first target frequency.

After the frequency of the first RC oscillator is adjusted according to the default gear of the first RC oscillator sequentially and at least one of the corresponding gear value and the corresponding frequency when the first device end may receive or may not receive the data sent by the second device end is recorded, for example after the frequency of the first RC oscillator is completely adjusted according to the default gear of the first RC oscillator and at least one of the corresponding gear value and the corresponding frequency when the first device end may receive or may not receive the second device end is recorded, or after the frequency of the first RC oscillator is adjusted according to the first regulation and the second regulation as mentioned and at least one of corresponding gear value and the corresponding frequency when the first device end may receive or may not receive the data sent by the second device end is recorded, the first target frequency and the first target gear value of the first RC oscillator are determined according to at least one of the frequency gear value and the frequency that is adjusted at the first communication frequency point when the first RC oscillator may receive or may not receive the data. The first target frequency is corresponding to the first target gear value, and may be determined according to the first target gear value. For example, a mean value of all gears at which the communication may be implemented normally is selected as the first target gear value of the first RC oscillator of the first device end, and accordingly the first target frequency is determined according to the first target gear value. The first target gear and the first target frequency are the optimal gear setting and the optimal frequency at the first communication frequency point.

For example, after the frequency of the first RC oscillator is completely adjusted according to the default gears, such as 1‰, 2‰, 3‰ and 4‰ of the first RC oscillator in the first communication time and at least one of the corresponding gear value and the corresponding frequency when the first device end may receive and fails to receive the data sent by the second device end is recorded, or after the frequency of the first RC oscillator is adjusted according to the first regulation and the second regulation as mentioned and at least one of the corresponding gear value and the corresponding frequency when the first device end may receive or may not receive the data sent by the second device end is recorded, a mean value of the corresponding gear values of all gears at which the communication may be implemented normally is acquired. For example, the corresponding gear values of all gears at which the communication may be implemented normally are 2‰, 3‰ and 4‰, and the mean value of the gear values are: (2‰+3‰+4‰)/3=3‰. The gear corresponding to the gear value 3‰ is taken as the optimal gear of the first RC oscillator of the sender, or the frequency corresponding to the gear value 3‰ is determined as the optimal frequency of the first RC oscillator of the sender.

At step S108, in a second communication time period, the first device end is controlled to communicate with the second device end at a second communication frequency point which is determined by the first target gear value.

In the technical solution provided by the above S108 of the present disclosure, after the first target frequency and the first target gear value of the first RC oscillator are determined, the second communication frequency point is determined according to the first target gear value, and the first device end is controlled to communicate with the second device end at the second communication frequency point in the second communication time period.

The second communication time period of the embodiment may be the data communication time period T2 as mentioned, and the first device end and the second device end are arranged to the second communication frequency point for communication. The second communication frequency point may be acquired through frequency doubling with the phase-locked loop of the first RC oscillator and represented by f2. If the first device end communicates with the second device end successfully, the communication is continued at the second communication frequency point. Namely, the first device end is continued to be controlled to communication with the second device end at the second communication frequency point in the second communication time period, and accordingly normal communication is implemented between the first device end and the second device end.

Optionally, in the second communication time period, the frequency of the first RC oscillator is calibrated according to the gear value 3‰. For example, in the second communication time period, a default frequency of the first RC oscillator is 2.48 Ghz. After determining the gear in the first communication time period, the frequency in the second communication time period is f2=(1+3‰)*2.48G. In this way, the gear is calibrated automatically, and accordingly the frequency is corrected through setting the gear.

Through the above steps S102-S108, the frequency of the first RC oscillator is adjusted at the first communication frequency point in the first communication time period. The first RC oscillator is arranged on the first device end, the first device end is configured to receive the data sent by the second device end, and the second device end is equipped with the second RC oscillator. At the first communication frequency point, the frequency of the first RC oscillator is adjusted according to the default gear of the first RC oscillator sequentially, and at least one of the corresponding gear value and the corresponding frequency when the first device end may receive or may not receive the data sent by the second device end is recorded. The first target frequency and the first target gear value of the first RC oscillator are determined according to at least one of the frequency gear value and the frequency that is adjusted at the first communication frequency point when the first RC oscillator may receive or may not receive the data. The first target gear value is corresponding to the first target frequency. After the first target frequency and the first target gear value of the first RC oscillator are determined, the first device end is controlled to communicate with the second device end at the second communication frequency point which is determined by the first target gear value in the second communication time period. The problem that the cost is great when improving the calibration accuracy of the RC oscillator is solved, and accordingly the effect of reducing the cost is achieved when improving the calibration accuracy of the RC oscillator.

As an optional mode of implementation, at step S108, the step that the first device end is controlled to communicate with the second device end at the second communication frequency point which is determined by the first target gear value in the second communication time includes that: whether or not the first device end successfully communicates with the second device end at the second frequency point in the second communication time period is detected. When successful communication between the first device end and the second device end is detected, the first device end is still controlled to communicate with the second device end at the second communication frequency point. When failed communication between the first device end and the second device end is detected, the second communication frequency point is replaced with a third communication frequency point. And the first device end is controlled to communicate with the second device end at the third communication frequency point in the second communication time period.

In the embodiment, when the first device end is controlled to communicate with the second device end in the second communication time period at the second communication frequency point which is determined by the first target gear value, whether the first device end successfully communicates with the second device end at the second frequency point in the second communication time period may be detected. Namely, whether the data between the first device end and the second device end is sent normally at the second communication frequency point in the second communication time period is detected. Optionally, in the second communication time period, data communication may be implemented for a time period. For example, the data may be sent for 10 times repeatedly with a total of 1 ms at the frequency point of 2.4 GHz. Whether the first device end successfully communicates with the second device end within 1 ms is judged, and the time period should be shorter than the first communication time period and the second communication time period. After detecting whether the first device end successfully communicates with the second device end at the second communication frequency point in the second communication time period and the successful communication between the first device end and the second device end is detected, the second communication frequency point is kept still, and the first device end is still controlled to communicate with the second device end at the second communication frequency point. When the first device end fails to communicate with the second device end, namely the data between the first device end and the second device end may not be sent normally in the first communication time period, the first device end and the second device end are subjected to frequency hopping to the third communication frequency point. Namely the second communication frequency point is replaced with the third communication frequency point, and the first device end is controlled to communicate with the second device end at the third communication frequency point in the second communication time period. Optionally, when the first device end still fails to communicate with the second device end in the second communication time period, both of the first device end and the second device end return to the first communication time period to calibrate the frequency again.

As an optional mode of implementation, at step S108, the step that the first device end is controlled to communicate with the second device end at the second communication frequency point which is determined by the first target gear value in the second communication time period includes that: in the second communication time period, a first time count value between receiving, by the first device end, first data and receiving, by the first device end, second data from the second device end, and the first data is data sent last time before the second device end sends the second data. The data carrying a second time count value sent by the second device end is received through the first device end, and the second time count value is a time count value between sending, by the second device end, the first data and sending, by the second device end, the second data. Whether the first time count value and the second time count value meet preset standards is determined. When determining that the first time count value and the second time count value do not meet the preset standards, at least one of the gear value and the frequency of the first RC oscillator is corrected at the second communication frequency point according to a difference between the first time count value and the second time count value.

In the embodiment, in the second communication time period, the first device end and the second device end are equipped with a counter to record time information, and an interval between two adjacent identical sending of data is recorded. The difference between two intervals is taken as a basis of correcting the frequency of the first RC oscillator. The first device end receives the data sent by the second device end and records the first time count value between two adjacent received data, and the second device end records the second time count value between two adjacent sent data. The second device end sends the second time count value to the first device end, then the first device end compares the second time count value with the first time count value and corrects at least one of the gear value and the frequency of the first RC oscillator at the second communication frequency point according to the difference between the first time count value and the second time count value.

Optionally, the first time count value between receiving, by the first device end, first data and receiving, by the first device end, second data from the second device end is recorded. The first time count value is used for indicating an interval between receiving, by the first device end, first data and receiving, by the first device end, second data from the second device end. The first data is data sent last time before the second device end sends the second data. The data carrying the second time count value sent by the second device end is received through the first device end. The second time count value is a time count value between sending, by the second device end, the first data and sending, by the second device end, the second data and is used for indicating an interval between sending, by the second device end, the first data and sending, by the second device end, the second data. After the first time count value between receiving, by the first device end, first data and receiving, by the first device end, second data from the second device end and the data carrying the second time count value sent by the second device end and is received through the first device end. Whether or not the first time count value and the second time count value meet the preset standards is determined. The preset standards may be those of determining whether the frequency of the first RC oscillator is corrected according to the first time count value and the second time count value. When determining that the first time count value and the second time count value do not meet the preset standards, for example, there is a difference between the first time count value and the second time count value, at least one of the gear value and the frequency of the first RC oscillator is corrected at the second communication frequency point according to the difference between the first time count value and the second time count value. For example, the frequency of the first RC oscillator is corrected at the second communication frequency point according to the difference between the first time count value and the second time count value. In this way, the first device end may correct the first RC oscillator in real time through comparing the recorded first time count value with the received second time count value.

Optionally, when the first device end is the sender and the second device end is the receiver, a count value of the counter from the last sending to current sending may be recorded at every sending of one packet by the sender, and the count value of the counter from the last receiving to current receiving may be recorded at every receiving of one packet by the receiver. The receiver, when replying a confirmation message in response to the data sent by the sender, may reply with the recorded count value to the sender, and the sender may correct the RC oscillator in real time through comparing the own record of count value with the received count value.

For example, in the second communication time period, an interval between two time periods of data sending of the sender is 8 ms, and an interval between two time periods of data receiving of the receiver is 8.2 ms. The sender may calculate the gear value to be tuned finely according to a time difference −0.2 ms through comparing 8 ms with the received 8.2 ms, and calculate a gear deviation to the frequency when sending the data next time to acquire the new frequency. This process is also known as a process of calibrating the frequency of the first RC oscillator.

As an optional mode of implementation, the first device end is the sender, and the second device end is the receiver. The first device end receives the data sent by the second device end includes that: the sender sends first sub-data to the receiver and receives a first confirmation message in response to the first sub-data from the receiver.

In the embodiment, the first device end may be the sender, the second device end may be the receiver, and the first sub-data may be sent to the receiver first for the sender when the first device end receives the data sent by the second device end. The first sub-data may be a packet and is used for verifying whether the sender communicates with the receiver normally. The receiver receives the first sub-data, and may respond to the first sub-data after the receiver receives the first sub-data to acquire the first confirmation message. The first confirmation message is used for indicating that the receiver successfully receives the first sub-data sent by the sender.

Optionally, the sender may receive the first confirmation message sent by the receiver, or fails to receive the first confirmation message sent by the receiver. For example, when the frequency of the first RC oscillator is adjusted according to the gear 1‰, the sender may receive the first confirmation information sent by the receiver, and the frequency of the first RC oscillator is continued to be adjusted at this moment according to the gear 2‰. When the frequency of the first RC oscillator is adjusted according to the gear 2‰, the sender may not receive the first confirmation message sent by the receiver, and the frequency of the first RC oscillator is continued to be adjusted at this moment according to the gear 3‰. When the frequency of the first RC oscillator is adjusted according to the gear 3‰, the sender may receive the first confirmation message sent by the receiver until the frequency of the first RC oscillator is adjusted according to the final default gear of the first RC oscillator. In the above process, after the frequency of the first RC oscillator is adjusted completely according to the default gear of the first RC oscillator, at least one of the corresponding gear value and the corresponding frequency when the sender may receive or may not receive the first confirmation message sent by the receiver is recorded, and the first target frequency and the first target gear value of the first RC oscillator are determined according to at least one of the corresponding gear value and the corresponding frequency when the sender may receive or may not receive the first confirmation message sent by the receiver. For example, from the corresponding gear values when the sender may receive or may not receive the first confirmation message sent by the receiver, the mean value of all gears at which the communication may be implemented normally is selected as the first target gear value of the first RC oscillator of the sender, and accordingly the first target frequency is determined according to the first target gear value.

Optionally, when the receiver fails to respond to the first sub-data sent by the sender all the time and the sender fails to receive the first confirmation message all the time, the frequency is continued to be adjusted according to the default regulation for adjustment. For example, the sender may adjust the frequency of the first RC oscillator as the first frequency according to the first regulation all the time. Optionally, the first regulation of the embodiment is to adjust the frequency of the first RC oscillator sequentially according to the positive direction and the negative direction of the default gear that is set by the first RC oscillator. For example, the frequency of the first RC oscillator is adjusted according to a change order and the change direction: +1‰, −1‰, +2‰, −2‰, +3‰, −3‰ . . . of the gear of the first oscillator until the first confirmation message that the receiver responds to sending of the first sub-data is received. The sender sends the first sub-data to the receiver at every setting of gear until the receiver receives the first sub-data sent by the sender, and returns the first confirmation message in response to the first sub-data.

Optionally, in this embodiment, under the circumstance that the frequency of the sender is calibrated, the first frequency of the sender is adjusted as the second frequency according to the second regulation when the sender receives the first confirmation message, in response to the first sub-data, sent by the receiver. The second regulation is that the sender stops setting the gears toward the opposite direction, but sets the gear of the first RC oscillator toward the identical change direction upon receiving the first confirmation message, in response to the first sub-data, sent by the receiver so as to adjust the frequency of the first RC oscillator. For example, when the gear setting of the sender is changed to +3‰, the receiver may receive the first sub-data sent by the sender, and return the first confirmation message in response to the first sub-data, and the sender sequentially sets the gears +4‰, +5‰, +6‰, . . . next so as to adjust the frequency of the sender.

After the first frequency of the sender is adjusted as the second frequency according to the second regulation, second sub-data is sent to the receiver through the sender under the second frequency. When the sender fails to receive a second confirmation message, in response to the second sub-data, sent by the receiver, the target frequency and the gear value of the first RC oscillator are determined according to the gear value of the first frequency, and the gear value of the first frequency is a gear value capable of enabling the sender communicates normally with the receiver.

Optionally, after the second sub-data is sent to the receiver through the sender, when the receiver receives the second sub-data sent by the sender and returns the second confirmation message all the time, the sender may always adjust the frequency of the first RC oscillator according to the second regulation and sends the second sub-data to the receiver until the receiver fails to respond to the second sub-data sent by the sender. Namely until the receiver may not receive the second sub-data normally and not respond to the second sub-data to acquire the second confirmation message, and the target frequency and the gear value of the first RC oscillator are determined according to the gear value of the first frequency. At this moment, the mean value of the corresponding gear values, including the gear value of the first frequency, of all gears at which the communication may be implemented normally is selected as the gear setting of the first RC oscillator of the sender, and accordingly the target frequency and the gear value of the first RC oscillator are determined.

As an optional mode of implementation, the first device end is the receiver, and the second device end is the sender. The first device end receives the data sent by the second device end, and that the receiver receives the first sub-data sent by the sender is included.

In the embodiment, the first device end may be the receiver and the second device end may be the sender, and the first device end receives the data sent by the second device end includes that: the receiver receives the first sub-data sent by the sender.

Optionally, the receiver may receive or may not receive the first sub-data sent by the sender. For example, when the frequency of the first RC oscillator of the receiver is adjusted according to the gear 1‰, the receiver may receive the first sub-data sent by the sender, and the frequency of the first RC oscillator is continued to be adjusted at this moment according to the gear 2‰. When the frequency of the first RC oscillator is adjusted according to the gear 2‰, the receiver may not receive the sub-data sent by the sender, and the frequency of the first RC oscillator is continued to be adjusted at this moment according to the gear 3‰. When the frequency of the first RC oscillator is adjusted according to the gear 3‰, the receiver may receive the sub-data sent by the sender until the frequency of the first RC oscillator is adjusted according to the final default gear of the first RC oscillator. In the above process, at least one of the corresponding gear value and the corresponding frequency when the sender may receive or may not receive the first sub-data sent by the sender is recorded after the frequency of the first RC oscillator is adjusted completely according to the default gear of the first RC oscillator. And the first target frequency and the first target gear value of the first RC oscillator are determined according to at least one of the corresponding gear value and frequency when the receiver may receive or may not receive the first confirmation message sent by the sender. For example, from the corresponding gear values when the receiver may receive or may not receive the first sub-data sent by the sender, the mean value of all gears at which the communication may be implemented normally is selected as the first target gear value of the first RC oscillator of the receiver, and accordingly the first target frequency is determined according to the first target gear value.

Optionally, when the receiver fails to receive the first sub-data sent by the sender all the time, the receiver may adjust the frequency of the first RC oscillator as the first frequency according to the first regulation until the first sub-data sent by the sender is received. When the receiver receives the first sub-data, the first frequency of the receiver is adjusted as the second frequency according to the second regulation. After the first frequency of the sender is adjusted as the second frequency according to the second regulation, under the second frequency, when the receiver fails to receive the data sent to the receiver through the sender, the first target gear value and the first target frequency of the first RC oscillator are determined according to the gear value of the first frequency. The gear value of the first frequency is a gear value of enabling the sender to communicate with the receiver normally. The mean value of corresponding gear values, including the gear value of the first frequency, of all gears at which the communication may be implemented normally is selected as the gear setting of the first RC oscillator of the sender, and accordingly the first target gear value and the first target frequency of the first RC oscillator are determined.

As an optional mode of implementation, under the circumstance that the frequency of the receiver is calibrated, the receiver responds to the data upon receiving the data sent by the sender to acquire the first confirmation message, sends the first confirmation message to the sender and adjusts the frequency of the receiver. Or under the circumstance that the frequency of the receiver is calibrated, the receiver responds to the data upon receiving the data sent by the sender to acquire the first confirmation message and adjusts the frequency of the receiver. The receiver fails to send the first confirmation message to the sender.

Under the circumstance that the frequency of the receiver is calibrated, the receiver may send the first confirmation message to the sender, or not send the confirmation message. The receiver may respond to the data upon receiving the data sent by the sender to acquire the first confirmation message and send the first confirmation message to the sender, and the frequency of the receiver is adjusted at this moment. Or under the circumstance that the frequency of the receiver is calibrated, the receiver responds to the data upon receiving the data sent by the sender to acquire the first confirmation message, or may not send the first confirmation message to the sender, but adjust the frequency of the receiver.

Optionally, under the circumstance that the frequencies of the receiver and the sender are calibrated, the receiver may respond to the first sub-data upon receiving the first sub-data sent by the sender to acquire the first confirmation message, send the first confirmation message to the sender and adjust the first frequency of the receiver as the second frequency of the receiver according to the second regulation. The first frequency of the sender may be adjusted as the second frequency of the sender according to the second regulation when the sender receives the first confirmation message. Under the circumstance that the frequency of the receiver is calibrated and the frequency of the sender is not calibrated, the receiver may respond to the first data upon receiving the first sub-data sent by the sender to acquire the first confirmation message, or not send the first confirmation message to the sender and adjust the first frequency of the receiver as the second frequency of the receiver according to the second regulation.

It is to be noted that when the frequency of the receiver is calibrated, the receiver may send or not send a confirmation message to the sender. When the frequency of the sender is calibrated, the receiver may send the confirmation message to the sender, and the sender receives the confirmation message and adjusts the frequency according to the second regulation as mentioned. Under the circumstance that the receiver returns the confirmation message to the sender, the frequency of the receiver or the sender may be adjusted, but adjusted asynchronously as far as possible. The receiver may also not send the confirmation message to the sender, and the frequency of the receiver may be adjusted at this moment.

As an optional mode of implementation, in the first communication time period, the first communication frequency point is replaced with a fourth communication frequency point when the first device end fails to receive the data sent by the second device end at the first communication frequency point. When the first communication frequency point is replaced with the fourth communication frequency point, the frequency of the first RC oscillator is adjusted at the fourth communication frequency point. When the data sent by the second device end is received in the first communication time period, the first target frequency and the first target gear value of the first RC oscillator are determined according to the frequency gear value of the first RC oscillator adjusted at the fourth communication frequency point. When the data sent by the second device end is not received in the first communication time, the fourth communication frequency point is continued to be replaced with a fifth communication frequency point.

In the embodiment, when the first device end fails to receive the data sent by the second device end at the first communication frequency point all the time, the first device end changes the first communication frequency point and continues to scan the gear. In the first communication time period, the first communication frequency point is replaced with the fourth communication frequency point when the first device end fails to receive the data sent by the second device end at the first communication frequency point and the frequency of the first RC oscillator is adjusted at the fourth communication frequency point. The frequency of the oscillator is started to be adjusted after hopping to the fourth communication frequency point. When the frequency of the first RC oscillator is adjusted at the fourth communication frequency point and when the data sent by the second device end is received in the first communication time period, the first target frequency and the first target gear value of the first RC oscillator are determined according to the frequency gear value of the first RC oscillator adjusted at the fourth communication frequency point. When the data sent by the second device end is not received in the first communication time period, the fourth communication frequency point is continued to be replaced with the fifth communication frequency point until the data sent by the second device end may be received in the first communication time. The first target frequency and the first target gear value of the first RC oscillator are determined so as to switch the first device end and the second device end to the second communication time period for communication.

As an optional mode of implementation, communication frequency points are acquired through doubling the frequencies of the first RC oscillator and the second oscillator in presence of the phase-locked loop. The communication frequency points include but not limited to the first communication frequency point and the second communication frequency point.

The embodiment acquires the communication frequency points through doubling the frequencies of the first RC oscillator and the second oscillator in presence of the phase-locked loop. The first communication frequency point and the second communication frequency point are generated through frequency doubling in presence of the phase-locked loop, and an amplification factor of the frequency of the phase-locked loop is settable. For example, the communication frequency points 2.41 Ghz and 2.42 Ghz are set by a doubled frequency of the phase-locked loop. When the first RC oscillator is 10 MHz, the doubled frequency is 241 h, and the communication frequency point that is acquired finally is 2.41 GHz.

It is to be noted that the steps shown in the flow chart in the drawings may be implemented in a computer system of a group of computer-executable instructions, and the steps as shown or described may be implemented in an order differing from here in some cases although the flow chart shows a logic order.

Embodiment Two

The technical solutions of the present disclosure will be illustrated below in combination with a preferred embodiment.

The embodiment provides a method of calibrating an RC oscillator through wireless communication. A sender and a receiver are equipped with the RC oscillator. A frequency may be corrected by setting a gear, and a correction accuracy may be a minimum change 1‰ of the frequency.

Communication frequency points of the receiver and the sender are subjected to frequency doubling on the basis of the frequency of the RC oscillator. The communication frequency points may be 2.4 GHz, 2.41 GHz, 2.42 GHz, 2.43 GHz, 2.44 GHz, 2.45 GHz, 2.46 GHz, 2.47 GHz, 2.48 GHz and so on, and the communication frequency points are numbers of fixed frequencies.

A wireless communication time period between the sender and the receiver is divided into a clock calibration time period T1 and a data communication time period T2. And the clock calibration time period T1 and the data communication time period T2 each may have several optional frequency points for communication.

The RC oscillator of the receiver may use a default correction gear to generate the frequency point f1, and the RC oscillator of the sender may use the default correction gear to generate the frequency point f1' as well. Due to influence of such factors as manufacturing process, temperature and voltage, there may be a frequency deviation between the RC oscillators of the sender and the receiver, and f1 may be inconsistent with f1'. When f1 is inconsistent with f1', the receiver may not receive data sent by the sender, and accordingly the sender may not communicate with the receiver normally. The receiver may receive the data sent by the sender when f1 is consistent with f1', and accordingly the sender may communicate with the receiving device end normally.

A method of adjusting the gear and the frequency of the RC oscillator of the sender is illustrated below.

Optionally, in the clock calibration time period T1, the frequency of the RC oscillator of the sender is adjusted through a default gear. The default gear may be 1‰, 2‰, 3‰, 4‰ and other gears, and the frequency of the RC oscillator of the sender is adjusted completely according to the 1‰, 2‰, 3‰, 4‰ and other gears sequentially. When adjusting the frequency of the RC oscillator of the sender completely according to the 1‰, 2‰, 3‰, 4‰ and other gears sequentially, the sender may receive or may not receive a confirmation message sent by the receiver, and the confirmation message is a message acquired when the receiver responds to the data sent by the sender. At least one of a corresponding gear value and the corresponding frequency when the sender may receive or may not receive the confirmation message sent by the receiver is recorded, and a target frequency and a target gear value of the RC oscillator of the sender are determined according to at least one of the corresponding gear value and the corresponding frequency when the sender may receive or may not receive the confirmation message sent by the receiver. For example, from the corresponding gear values when the sender may receive or may not receive the confirmation message sent by the receiver, a mean value of all gears at which communication may be implemented normally is selected as the target gear value of the RC oscillator of the sender, and accordingly the target frequency of the RC oscillator of the sender is determined according to the target gear value.

Optionally, a first oscillator is arranged on the sender, a second oscillator is arranged on the receiver, and the sender sends the data sent by the receiver. The sender, when receiving the confirmation message that the receiver responds to sending of the data, calibrates the frequency of the sender (the first oscillator) according to a first regulation. The sender, when receiving the confirmation message that the receiver responds to sending of the data, continues to calibrate the frequency of the sender according to a second regulation. For example, in the clock calibration time period T1, the sender adjusts the frequency of the RC oscillator through setting the gear and adjusts sequentially toward a positive direction and a negative direction of the default gear of the RC oscillator, for example, the gear with changes: +1‰, −1‰, +2‰, −2‰, +3‰, −3‰ .... After setting the gear each time, the sender sends the data to the receiver until the receiver receives the data. After responding to the data and returning the confirmation message, the sender stops setting the gear toward an opposite direction, but sets the gear toward the identical change direction for communication until the receiver may not communicate with the sender. For example, when the change is set to +3‰, the receiver may receive the confirmation message and return the confirmation message to the sender, and the gears are set below: +4‰, +5‰, +6‰ ... sequentially until the receiver may not receive the data normally and may not return the confirmation message to the sender. At this moment, the mean value of all gears at which the communication may be implemented normally is selected as gear setting of the RC oscillator of the sender.

In the clock calibration time period T1, the receiver adjusts the frequency circularly at a regular interval between calibration frequency points. The sender, when failing to receive the confirmation message of the receiver at certain frequency point all the time, may change the calibration frequency point and continue to scan the gear of the RC oscillator until the optimal gear setting is found at certain frequency point, and the sender and the receiver switch to the data communication time period T2 for communication.

In the data communication time period T2, the sender and the receiver are set to the frequency point f2 for communication. When the sender communicates with the receiver at the frequency point f2 successfully, the communication is continued at the frequency point f2. When the sender fails to communicate with the receiver at the frequency point f2, the sender and the receiver may hop to the next frequency point for communication. When the communication still fails in the data communication time period T2, the sender and the receiver may return to a state of the clock calibration time period T1 to wait for clock calibration of the sender.

When data communication is implemented between the sender and the receiver in the communication time period T2, the sender and the receiver are equipped with a counter to record time information. A count value of the counter from the last sending to current sending is recorded at every sending of one packet by the sender, the count value of the counter from the last receiving to current receiving is recorded at every receiving of one packet by the receiver, and the receiver gives a reply with the count value to the sender when replying the confirmation message. The sender carries out real-time correction of the RC oscillator by comparing the count value of the sender with the received count value. In this way, the problem that the cost is great when improving the calibration accuracy of the RC oscillator is solved, and accordingly the effect of reducing the cost is achieved when improving the calibration accuracy of the RC oscillator.

A method of adjusting the gear and the frequency of the RC oscillator of the receiver is illustrated below.

Optionally, in the clock calibration time period T1, the frequency of the RC oscillator of the receiver is adjusted through a default gear. The default gear may be 1‰, 2‰, 3‰, 4‰ and other gears, and the frequency of the RC oscillator of the receiver is adjusted completely according to the 1‰, 2‰, 3‰, 4‰ and other gears sequentially. When adjusting the frequency of the RC oscillator of the receiver completely according to the 1‰, 2‰, 3‰, 4‰ and other gears sequentially, the receiver may receive or may not receive the data sent by the sender, at least one of a corresponding gear value and a corresponding frequency when the receiver may receive or may not receive the data sent by the sender is recorded, and a target frequency and a target gear value of the RC oscillator of the receiver are determined according to at least one of the corresponding gear value and the corresponding frequency when the receiver may receive or may not receive the data sent by the receiver. For example, from the corresponding gear values when the receiver may receive or may not receive the data sent by the receiver, a mean value of all gears at which communication may be implemented normally is selected as the target gear value of the RC oscillator of the receiver, and accordingly the target frequency of the RC oscillator of the receiver is determined according to the target gear value.

Optionally, the sender sends the data to the receiver. Under the circumstance that the receiver fails to receive the data sent to the receiver through the sender, the frequency of the receiver (a second oscillator) is calibrated according to a first regulation. Under the circumstance that the receiver receives the data sent to the receiver through the sender, the frequency of the receiver is calibrated according to a second regulation. It is to be noted that the receiver may send or not send a confirmation message to the sender under this condition.

In the embodiment, the frequencies of the oscillators of the sender and the receiver may be adjusted. However during adjustment, the frequency of the oscillator of the sender may not be adjusted before the receiver sends the confirmation message of responding to the data sent by the sender to the sender, while when adjusting the frequency of the oscillator of the receiver, the receiver is not required to send the confirmation message of responding to the data sent by the sender to the sender. Real-time correction of the RC oscillator is carried out in this embodiment and solves the problem that the cost is great when improving the calibration accuracy of the RC oscillator, and accordingly achieves the effect of reducing the cost when improving the calibration accuracy of the RC oscillator.

Embodiment Three

The embodiment of the present disclosure further provides a device for calibrating an RC oscillator. It is to be noted that the device for calibrating the RC oscillator of the embodiment may be configured to execute the method for calibrating the RC oscillator of the embodiments of the present disclosure.

Figure 2:
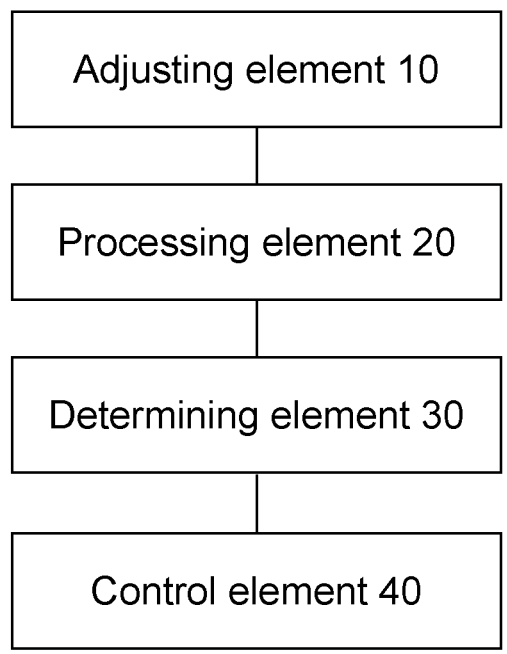
FIG. 2 is a schematic diagram of a device for calibrating an RC oscillator according to an embodiment of the present disclosure.

FIG. 2 is a schematic diagram of the device for calibrating the RC oscillator according to an embodiment of the present disclosure. As shown in FIG. 2, the device for calibrating the RC oscillator includes an adjusting element 10, a processing element 20, a determining element 30 and a control element 40.

The adjusting element 10 is configured to adjust a frequency of a first RC oscillator at a first communication frequency point in a first communication time period. The first RC oscillator is arranged on a first device end. The first device end is configured to receive data sent by a second device end, and the second device end is equipped with a second RC oscillator.

The processing element 20 is configured to adjust the frequency of the first RC oscillator sequentially according to a default gear of the first RC oscillator at the first communication frequency point and record at least one of a corresponding gear value and a corresponding frequency when the first device end may receive or may not receive the data sent by the second device end.

The determining element 30 is configured to determine a first target frequency and a first target gear value of the first RC oscillator according to the at least one of a corresponding gear value and a corresponding frequency. The first target gear value is corresponding to the first target frequency.

The control element 40 is configured to control the first device end to communicate with the second device end at a second communication frequency point which is determined by the first target gear value in a second communication time period after determining the first target frequency and the first target gear value of the first RC oscillator.

The control element 40 includes a detection component, a control component and a processing component. The detection component is configured to detect whether or not the first device end successfully communicates with the second device end at the second communication frequency point in the second communication time period. The control component is configured to control the first device end to communicate with the second device end at the second communication frequency point when successful communication between the first device end and the second device end is detected. The processing component is configured to replace the second communication frequency point with a third communication frequency point when failed communication between the first device end and the second device end is detected, and control the first device end to communicate with the second device end at the third communication frequency point in the second communication time period.

The control element 40 includes a recording component, a receiving component, a determining component and a correction component. The recording component is configured to record, in the second communication time period, a first time count value between receiving, by the first device end, first data and receiving, by the first device end, second data from the second device end, and the first data is data sent last time before the second device end sends the second data. The receiving component is configured to receive data carrying a second time count value sent by the second device end through the first device end, and the second time count value is a time count value between sending, by the second device end, the first data and sending, by the second device end, the second data. The determining component is configured to determine whether the first time count value and the second time count value meet preset standards. The correction component is configured to correct at least one of the gear value and the frequency of the first RC oscillator at the second communication frequency point according to a difference between the first time count value and the second time count value when determining that the first time count value and the second time count value do not meet the preset standards.

Optionally, the first device end is a sender, and the second device end is a receiver. The first device end receives the data sent by the second device end includes that: the receiver receives first sub-data sent by the sender and sends a first confirmation message to the sender in response to the first sub-data.

Optionally, the first device end is the receiver, and the second device end is the sender. The first device end receives the data sent by the second device end includes that: the receiver receives the first sub-data sent by the sender.

Optionally, the device further includes a response element. The response element is configured to respond, under the circumstance that a frequency of the receiver is to be calibrated, to the data when the receiver receives the data sent by the sender to acquire a first confirmation message, send the first confirmation message to the sender and adjusting the frequency of the receiver; or respond, under the circumstance that a frequency of the receiver is to be calibrated, to the data when the receiver receives the data sent by the sender to acquire a first confirmation message, and adjust the frequency of the receiver, and the first confirmation message is failed to sent from the receiver to the sender.

Optionally, the device further includes a first replacement element, a first adjusting element, a first determining element and a second replacement element. The first replacement element is configured to replace the first communication frequency point with a fourth communication frequency point in the first communication time period when the first device end fails to receive the data sent by the second device end at the first communication frequency point. The first adjusting element is configured to adjust the frequency of the first RC oscillator at the fourth communication frequency point after replacing the first communication frequency point with the fourth communication frequency point. The first determining element is configured to determine the first target frequency and the first target gear value of the first RC oscillator according to a frequency gear value of the first RC oscillator adjusted at the fourth communication frequency point when the data sent by the second device end is received in the first communication time period. The second replacement element is configured to continue to replace the fourth communication frequency point with a fifth communication frequency point when the data sent by the second device end is not received in the first communication time period.

Optionally, frequency doubling is performed to the first RC oscillator and the second RC oscillator through a phase-locked loop to acquire communication frequency points, and the communication frequency point at least includes the first communication frequency point and the second communication frequency point.

The embodiment adjusts the frequency of the first RC oscillator as the first frequency through the first adjusting element 10 according to a first regulation, and the first RC oscillator is arranged on the sender. The first sending element 20 is configured to send the first data to the receiver through the sender under the first frequency. The receiver is equipped with the second RC oscillator. The first frequency is adjusted as the second frequency through a first calibration element 30 according to the second regulation upon receiving the first confirmation message that the receiver responds to sending of the first data. Under the second frequency, the second data is sent to the receiver through the sender. When the second confirmation information that the receiver responds to sending of the second data is not received, the target frequency and the gear value of the first RC oscillator are determined according to the gear value of the first frequency. Further a second calibration element 40 adjusts the first frequency of the second RC oscillator as a third frequency according to the second regulation when the receiver receives the first data. Under the third frequency, the receiver is made to receive the second data sent to the receiver through the sender. When the second data is not received, the target frequency and the gear value of the second RC oscillator are determined according to the gear value of the third frequency. The problem that the cost is great when improving the calibration accuracy of the RC oscillator is solved, and accordingly the effect of reducing the cost is achieved when improving the calibration accuracy of the RC oscillator.

Embodiment Four

The embodiment of the present disclosure further provides a storage medium. The storage medium includes at least one stored program, and a device where the storage medium is located is controlled to execute a method for calibrating an RC oscillator of the present disclosure when the at least one stored program runs.

Embodiment Five

The embodiment of the present disclosure further provides a processor. The processor is configured to run at least one program. A method for calibrating an RC oscillator of the present disclosure is executed when the at least one program runs.

It is apparent that those skilled in the art should understand that each component or each step of the above present disclosure may be implemented with a universal calculating device, may be concentrated on a single computing device, or distributed on a network formed by multiple computing devices, and optionally may be implemented with executable program codes of the computing device. Accordingly, each component or each step may be stored in a storage device and implemented by the computing device, or fabricated into each integrated circuit component, or multiple components or steps between these components or steps may be fabricated into a single integrated circuit component for implementation. In this way, the present disclosure shall not be limited by any specific combination of software and hardware.

The above are exemplary embodiments of the present disclosure and are not intended to limit the present disclosure. For those skilled in the art, the present disclosure may have various modifications and variations. Any modifications, equivalent replacements, improvements and the like within the spirit and principle of the present disclosure shall fall within the scope of protection of the present disclosure.

What is claimed is:

1. A method for calibrating one RC oscillator, comprising:
adjusting, in a first communication time period, a frequency of the one RC oscillator at a first communication frequency point, wherein the one RC oscillator is arranged on a first device end, the first device end is configured to receive data sent by a second device end, and the second device end is equipped with an other one RC oscillator;
adjusting, at the first communication frequency point, the frequency of the one RC oscillator according to a default gear of the one RC oscillator sequentially, and recording at least one of a corresponding gear value and a corresponding frequency when the first device end receives or fails to receive the data sent by the second device end;
determining a first target frequency and a first target gear value of the one RC oscillator according to the at least one of a corresponding gear value and a corresponding frequency, wherein the first target gear value is corresponding to the first target frequency; and
controlling the first device end to communicate with the second device end at a second communication frequency point which is determined by the first target gear value in a second communication time period after determining the first target frequency and the first target gear value of the one RC oscillator; wherein the method further comprises:
replacing the first communication frequency point with a fourth communication frequency point in the first communication time period when the first device end fails to receive the data sent by the second device end at the first communication frequency point;
adjusting the frequency of the one RC oscillator at the fourth communication frequency point when the first communication frequency point is replaced with the fourth communication frequency point;
determining the first target frequency and the first target gear value of the one RC oscillator according to a frequency gear value of the one RC oscillator adjusted at the fourth communication frequency point when the data sent by the second device end is received in the first communication time period; and
continuing to replace the fourth communication frequency point with a fifth communication frequency point when the data sent by the second device end is not received in the first communication time period.

2. The method as claimed in claim 1, wherein controlling the first device end to communicate with the second device end at the second communication frequency point which is determined by the first target gear value in the second communication time period comprises:
detecting whether or not the first device end successfully communicates with the second device end at the second communication frequency point in the second communication time period;
controlling the first device end to communicate with the second device end at the second communication frequency point when successful communication between the first device end and the second device end is detected; and
replacing the second communication frequency point with a third communication frequency point when failed communication between the first device end and the second device end is detected, and controlling the first device end to communicate with the second device end at the third communication frequency point in the second communication time period.

3. The method as claimed in claim 1, wherein controlling the first device end to communicate with the second device end at the second communication frequency point which is determined by the first target gear value in the second communication time period comprises:

recording, in the second communication time period, a first time count value between receiving, by the first device end, first data and receiving, by the first device end, second data from the second device end, wherein the first data is data sent last time before the second device end sends the second data;

receiving data carrying a second time count value sent by the second device end through the first device end, wherein the second time count value is a time count value between sending, by the second device end, the first data and sending, by the second device end, the second data;

determining whether the first time count value and the second time count value meet preset standards; and correcting at least one of the gear value and the frequency of the one RC oscillator at the second communication frequency point according to a difference between the first time count value and the second time count value when determining that the first time count value and the second time count value do not meet the preset standards.

4. The method as claimed in claim 1, wherein the first device end is a sender, and the second device end is a receiver; and receiving, by the first device end, the data sent by the second device end comprising: receiving, by the receiver, first sub-data sent by the sender and sending, by the receiver, a first confirmation message to the sender in response to the first sub-data.

5. The method as claimed in claim 1, wherein the first device end is a receiver, and the second device end is a sender; and receiving, by the first device end, the data sent by the second device end comprising: receiving, by the receiver, a first sub-data sent by the sender.

6. The method as claimed in claim 5, wherein the method further comprises:

responding, under the circumstance that a frequency of the receiver is to be calibrated, to the data when the receiver receives the data sent by the sender to acquire a first confirmation message, sending the first confirmation message to the sender and adjusting the frequency of the receiver; or responding, under the circumstance that a frequency of the receiver is to be calibrated, to the data when the receiver receives the data sent by the sender to acquire a first confirmation message, and adjusting the frequency of the receiver, wherein the first confirmation message is failed to sent from the receiver to the sender.

7. The method as claimed in claim 1, wherein frequency doubling is performed to the one RC oscillator and the other one RC oscillator through a phase-locked loop to acquire communication frequency points, and the communication frequency point at least comprises the first communication frequency point and the second communication frequency point.

8. A device for calibrating one RC oscillator, comprising:

an adjusting element, configured to adjust a frequency of the one RC oscillator at a first communication frequency point in a first communication time period, wherein the one RC oscillator is arranged on a first device end, the first device end is configured to receive data sent by a second device end, and the second device end is equipped with an other one RC oscillator;

a processing element, configured to adjust the frequency of the one RC oscillator according to a default gear of the one RC oscillator sequentially at the first communication frequency point and record at least one of a corresponding gear value and a corresponding frequency when the first device end receives or fails to receive the data sent by the second device end;

a determining element, configured to determine a first target frequency and a first target gear value of the one RC oscillator according to the at least one of a corresponding gear value and a corresponding frequency, wherein the first target gear value is corresponding to the first target frequency; and a control element, configured to control the first device end to communicate with the second device end at a second communication frequency point which is determined by the first target gear value in a second communication time period after determining the first target frequency and the first target gear value of the one RC oscillator;

wherein the device further comprises: a first replacement element, configured to replace the first communication frequency point with a fourth communication frequency point in the first communication time period when the first device end fails to receive the data sent by the second device end at the first communication frequency point; a first adjusting element, configured to adjust the frequency of the one RC oscillator at the fourth communication frequency point after replacing the first communication frequency point with the fourth communication frequency point; a first determining element, configured to determine the first target frequency and the first target gear value of the one RC oscillator according to a frequency gear value of the one RC oscillator adjusted at the fourth communication frequency point when the data sent by the second device end is received in the first communication time period; a second replacement element, configured to continue to replace the fourth communication frequency point with a fifth communication frequency point when the data sent by the second device end is not received in the first communication time period.

9. A storage medium, comprising at least one stored program, wherein a device where the storage medium is located is controlled to execute the method for calibrating the one RC oscillator as claimed in claim 1 when the at least one stored program runs.

10. A processor, which is configured to run at least one program, wherein the method for calibrating the one RC oscillator as claimed in claim 1 is executed when the at least one stored program runs.

* * * * *